United States Patent
Hammel (10) Patent No.: US 6,721,375 B1
(45) Date of Patent: Apr. 13, 2004

(54) METHOD AND DEVICE FOR COMPENSATING PHASE DELAYS

(75) Inventor: Christof Hammel, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/600,466

(22) PCT Filed: Sep. 23, 1999

(86) PCT No.: PCT/DE99/03046

§ 371 (c)(1),
(2), (4) Date: Jul. 17, 2000

(87) PCT Pub. No.: WO00/31875

PCT Pub. Date: Jun. 2, 2000

(30) Foreign Application Priority Data

Nov. 23, 1998 (DE) .......................... 198 53 897

(51) Int. Cl.[7] ................................. H04B 1/10
(52) U.S. Cl. ........................ 375/350; 375/355
(58) Field of Search ................. 375/350, 316, 375/355; 708/313; 341/126, 155

(56) References Cited

U.S. PATENT DOCUMENTS 4,694,414 A * 9/1987 Christopher ................ 708/313
5,787,387 A * 7/1998 Aguilar ...................... 704/208
5,815,580 A * 9/1998 Craven et al. ................ 381/58
5,841,811 A * 11/1998 Song ........................... 375/235
2002/0114270 A1 * 8/2002 Pierzga et al. .............. 370/208

FOREIGN PATENT DOCUMENTS

DE 195 14 410 A1 10/1996
WO 98 23037 A 5/1998

\* cited by examiner

Primary Examiner—Don N. Vo
(74) Attorney, Agent, or Firm—Michael J. Striker

(57) ABSTRACT

A method for compensation of phase delays that occur in discrete sampling of an analog output signal ($U_S$) has the steps of subjecting the output signal ($U_S$) to signal processing by an anti-aliasing filter and then by a sampling member to obtain a sampling signal ($U_A$) that has a sampling period (T), compensating a phase delay of the sampling signal caused by the sampling member, taking into account the sampling signal of a preceding sampling period to obtain a signal ($U_{F,K}$), and compensating of the phase delay of the sampling signal caused by the anti-aliasing filter, taking into account a filter time constant ($T_F$) of the anti-aliasing filter, a sampling period ($T_A$) of the sampling member, and the sampling signal of the preceding sampling period, to obtain a signal ($U_{SK}$).

13 Claims, 8 Drawing Sheets

METHOD AND DEVICE FOR COMPENSATING PHASE DELAYS

BACKGROUND OF THE INVENTION

The present invention relates to a method and an arrangement for compensation of phase delays[, as generically defined by the preambles to claims 1 and 8, respectively].

In numerous technical applications, there is a need for converting an analog sensor signal into a digital signal. Because of the individual members of a signal detection chain used for this purpose, delays occur between the original analog signal and the digital signal that is to be further processed.

From German Patent Disclosure DE-OS 195 14 410, a device for detecting a pulsating variable is known, in which, to assure that a signal without oscillation would be obtained, an electronic filter is provided, which is constructed as an analog circuit and has at least one first member for differentiation and delay and one second member for multiplication of the differentiated and delayed signal, as well as a subtraction stage, in which the filtered signal can be subtracted from the unfiltered signal in order to generate a smoothed output signal. The object of this reference is to smooth a pulsating input signal; it does not address signal errors that occur from phase delays in a signal detection chain for converting a digital signal into an analog signal.

SUMMARY OF THE INVENTION

The object of the invention is a compensation, to be done in a simple way, that is, at the least possible expense for circuitry, of phase delays which occur in discrete-time sampling of an analog output signal and which lead to an error in the sampled digital signal.

According to the invention, effective, easy to achieve compensation of phase delays that occur in discrete-time sampling of an analog output signal is now made available. Phase delays that result from signal processing by an anti-aliasing filter as well as a sampling member are compensated for according to the invention in reverse order of their creation.

Expediently, the case of a further phase delay of the sampling signal, caused by an idle time, in particular an idle time which occurs in further processing of the sampling signal and by which an idle-time-delayed sampling signal is generated, a compensation of the phase delay of the sampling signal, caused by the idle time, is performed taking into account the idle time and the sampling period of the sampling member, to obtain an idle-time-compensated sampling signal, and the idle-time-compensated sampling signal is subjected to the phase shift compensations of claim 1 for the sake of further phase compensation. Thus in an effective, phase delays which occur between the sampling of the signal and its re-use (for instance in a regulator or in a correction function), can be compensated for.

Expediently, a phase delay caused by the sampling member, which delay can be represented by the equation $$\varphi_A = \omega \cdot \frac{1}{2} \cdot T_A = -2 \cdot \pi \cdot f \cdot \frac{T_A}{2} - \pi \cdot f \cdot T_A$$

in which f is the signal frequency and $T_A$ is the sampling period of the sampling member, is corrected by means of a linear extrapolation using a correction value of the form $-Y_{k,2}=X_k+\frac{1}{2}\cdot(x_k-x_{k-1})$, in which $x_{k-1}$, $x_k$ are values of the sampling signal in successive sampling periods $T_{T,k-1}$, $T_{T,k}$. This correction can be performed by computer at relatively little effort or expense and represents a very good compensation for typical phase delays that occur in sampling members.

Expediently as well, a phase delay which is caused by the anti-aliasing filter and can be represented in the form $\phi_F = -\arctan(2 \cdot \pi \cdot f \cdot T_F)$, in which $T_F$ is the filter time constant of the anti-aliasing filter, is corrected by a correction value of the form $y_{k,3}=x_k+T_F/T_A \cdot (x_k-x_{k-1})$. This correction can also be performed inexpensively, and compensates with sufficient accuracy for a phase delay caused by an anti-aliasing filter.

In an advantageous embodiment of the invention, furthermore, a phase delay which is caused by the idle time $T_T$ and can be represented in the form $\phi_V = -\arctan(2\pi f T_F) - \pi f T_A - 2\pi f T_T$ is corrected by a correction value of the form $$y_{k,1} = x_k\left(1 + \frac{T_T}{T_A}\right) - x_{k-1} \cdot \frac{T_T}{T_A}$$

This clearly means that the error occurring during the idle time $T_T$ is imposed on the sampling signal with an inverse sign in the next sampling step and thus is corrected. This compensation likewise furnishes good correction results and can be performed in a simple way.

Expediently, the individual phase delay compensations are performed successively, so that in all, for correcting a sampling signal during one sampling period, sampling signals of two or three preceding sampling periods are taken into account.

It proves to be advantageous that the individual phase delay compensations perform in reverse order from the order in which they occurred, so that partly compensated signals are also available.

In a preferred embodiment of the arrangement according to the invention for compensation for phase delays, the means for compensation of the phase delay caused by the sampling member, the anti-aliasing filter, or the further processing idle time, each have three parallel signal transmission channels, in which a first signal transmission channel serves to transmit an unaltered sampling signal; a second signal transmission channel, having a multiplier member, serves to transmit a sampling signal multiplied by a factor, and a third signal transmission channel, having a delay member and a multiplier member, serves to transmit a sampling signal, delayed by one sampling period and multiplied by a factor, to a summation member.

It proves to be expedient that the means for compensation of the phase delay caused by the sampling member, the anti-aliasing filter, or the further processing idle time, are connected in series with one another in such a way that in all, a phase-compensated output signal $U_{S,K}$ is obtained, taking into account the uncompensated sampling signals of the preceding three sampling periods.

In a further preferred embodied of the arrangement of the invention, this arrangement has three series-connected delay members $z^{-1}$, multiplier members connected to them and parallel to one another, and a summation member for adding the output signals of the multiplier members to achieve a phase compensation for obtaining a phase-compensated sampling signal $U_{S,K}$ of the form $$U_{S,K}(k)=A \cdot U_T(k)+B \cdot U_T(k-1)+C \cdot U_T(k-2)+D \cdot U_T(k-3)$$

in which $U_T(k-i)$, where i=0, 1, 2, 3, represents the uncompensated sampling signal $U_T$ delayed by i sampling periods, and A, B, C, D are system constants of the signal sampling path. Thus at little computational effort, it is possible to achieve the phase compensation of the invention, since the system constants A, B, C, D are predeterminable and do not have to be regularly re-calculated.

In a further preferred feature of the arrangement of the invention, this arrangement has means for turning off the phase compensation in the event that a change in the input signal within one sampling period exceeds a threshold value. As a result, severe fluctuations in the compensated signal in the event of very fast signal changes at the input to the compensation can effectively be prevented.

BRIEF DESCRIPTION OF THE DRAWINGS

The present invention will not be explained in detail in conjunction with the accompanying drawing.

DESCRIPTION OF THE PREFERRED EMBODIMENTS

Figure 1:
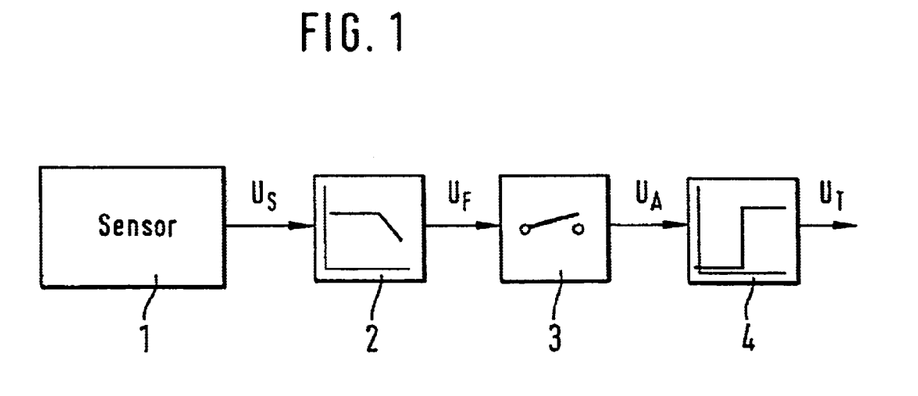
FIG. 1 is a block circuit diagram of a signal detection chain for sampling an analog sensor signal.

The individual members of a signal detection chain, which is used for converting an analog sensor output signal $U_S$ into a digital signal $U_T$, are shown in FIG. 1.

A sensor 1 generates the output signal $U_S$. Reference numeral 2 indicates an anti-aliasing filter, which serves to prevent aliasing effects from an ensuing sampling of the signal. The anti-aliasing filter is typically embodied as a low-pass filter. In order to meet the condition of the sampling theorem, the relationship $f_g < \frac{1}{2} \cdot f_A$ must apply, in which $f_g$ is the limit frequency of the anti-aliasing filter 2 embodied as a low-pass filter, and $f_A$ is the sampling frequency of the following sampling member 3. In the simplest case, this low-pass filter is a PT1 member (proportional-idle-time member) with the transfer function $$G_{TP}(s) = \frac{1}{1 + s \cdot T_F}$$

In this equation, s is the complex frequency variable $s = \sigma + j\omega$, and $T_F$ is the filter time constant. The phase delay of such a low-pass filter is $\phi_F = -\arctan(2\pi \cdot f \cdot T_F)$. The output signal of the anti-aliasing filter 2 is designated as $U_F$.

Figure 2:
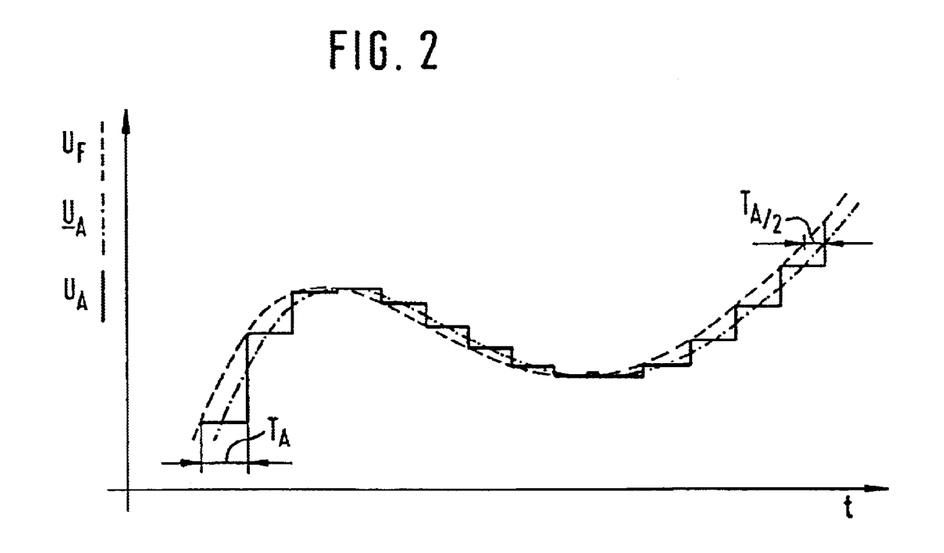
FIG. 2 is a graph showing a phase delay that occurs by sampling with a sampling member.

In the sampling member or sample member 3 downstream of the anti-aliasing filter 2, the signal values are sampled at discrete instants $t = k \cdot T_A$, in which $k = 0, 1, 2, 3, \ldots$, and $T_A$ is the sampling period of the sampling member 3. The output signal of the sampling member is marked $U_A$. The principle of the sampling is illustrated in FIG. 2. It can be seen that the mean voltage $\underline{U}_A$ of the signal $U_A$ is delayed relative to $U_F$ by half the sampling period. The phase delay therefore becomes $$\varphi_A = -\omega \cdot \frac{1}{2} \cdot T_A = -2 \cdot \pi \cdot f \cdot \frac{T_A}{2} = -\pi \cdot f \cdot T_A.$$

The signal $U_A$ represents the actual digital signal intended for further processing. However, because of delays between the sampling task and a downstream task, such as a regulator task, a time lag occurs between the sampling and the re-use of the signal value $U_A$ (this is known as the idle time between the sampling and a downstream function). This phase delay is $\phi_T = -\omega \cdot T_T = -2 \cdot \pi \cdot f \cdot T_T$. The signal (work signal) delayed by the idle time that finally results is designated as $U_T$ in FIG. 1. The portion of the signal detection path along which this phase delay occurs is symbolically represented by reference numeral 4.

The signal delay in the sensor output signal $U_S$ that occurs because of the signal detection path 2, 3, 4 therefore amounts in total $\phi_V = -\arctan(2\pi f T_F) - \pi f T_A - 2\pi f T_T$.

Even relatively slight phase delays have a major effect on the error between the analog signal $U_S$ and the work signal $U_T$. If $$U_S(t) = \hat{U}_S \cdot \sin(\omega t),$$

then $$U_T(t) = \hat{U}_T \cdot \sin(\omega t - \phi_V).$$

$\hat{u}_S$ and $\hat{u}_T$ are the amplitudes of the respective signals $U_S$ and $U_T$.

The error becomes $$U_e(t) = \hat{U}_S \cdot \sin(\omega t) - \hat{U}_T \cdot \sin(\omega t - \phi_V).$$

To simplify, a slight signal damping can be assumed, so that $\hat{u}_T = \hat{u}_S$ can be set. It thus follows that $$U_e(t) = \hat{U}_S \cdot [\sin(\omega t) - \sin(\omega t - \phi_V)] = 2 \cdot \hat{U}_S \cdot \sin(\phi_V / 2) \cdot \cos(\omega t - \phi_V / 2).$$

The amplitude of the error is therefore determined by the signal amplitude $\hat{u}_S$ and the phase delay $\phi_V$. However, a reduction in the error can be done only by reducing the phase delay. Because of limited computation power in the digital processor system, however, this is often only inadequately possible.

The invention seeks to compensate for the incident phase delays in the simplest possible way.

Figure 3:
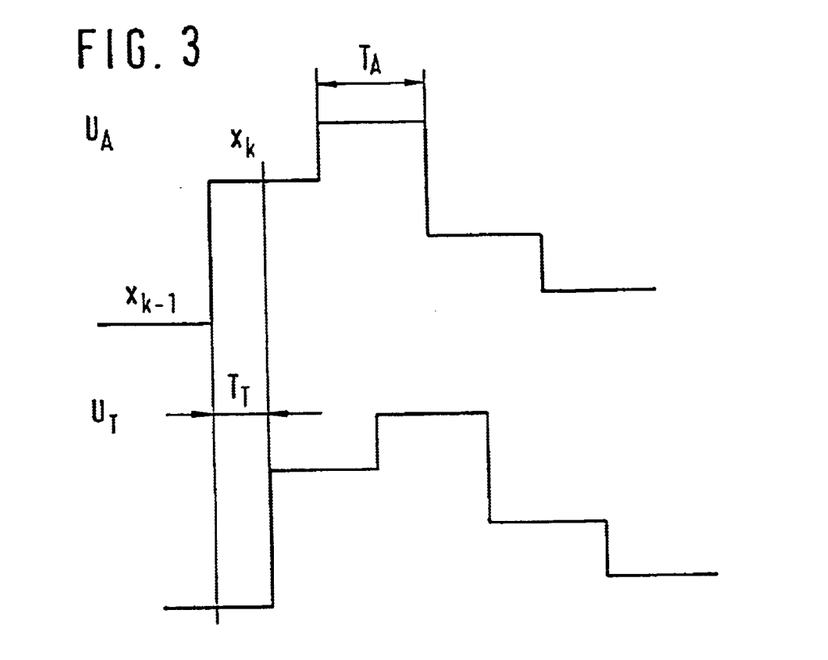
FIG. 3 is a graph showing a signal delay that occurs in further processing because of an idle time.
Figures 5, 6:
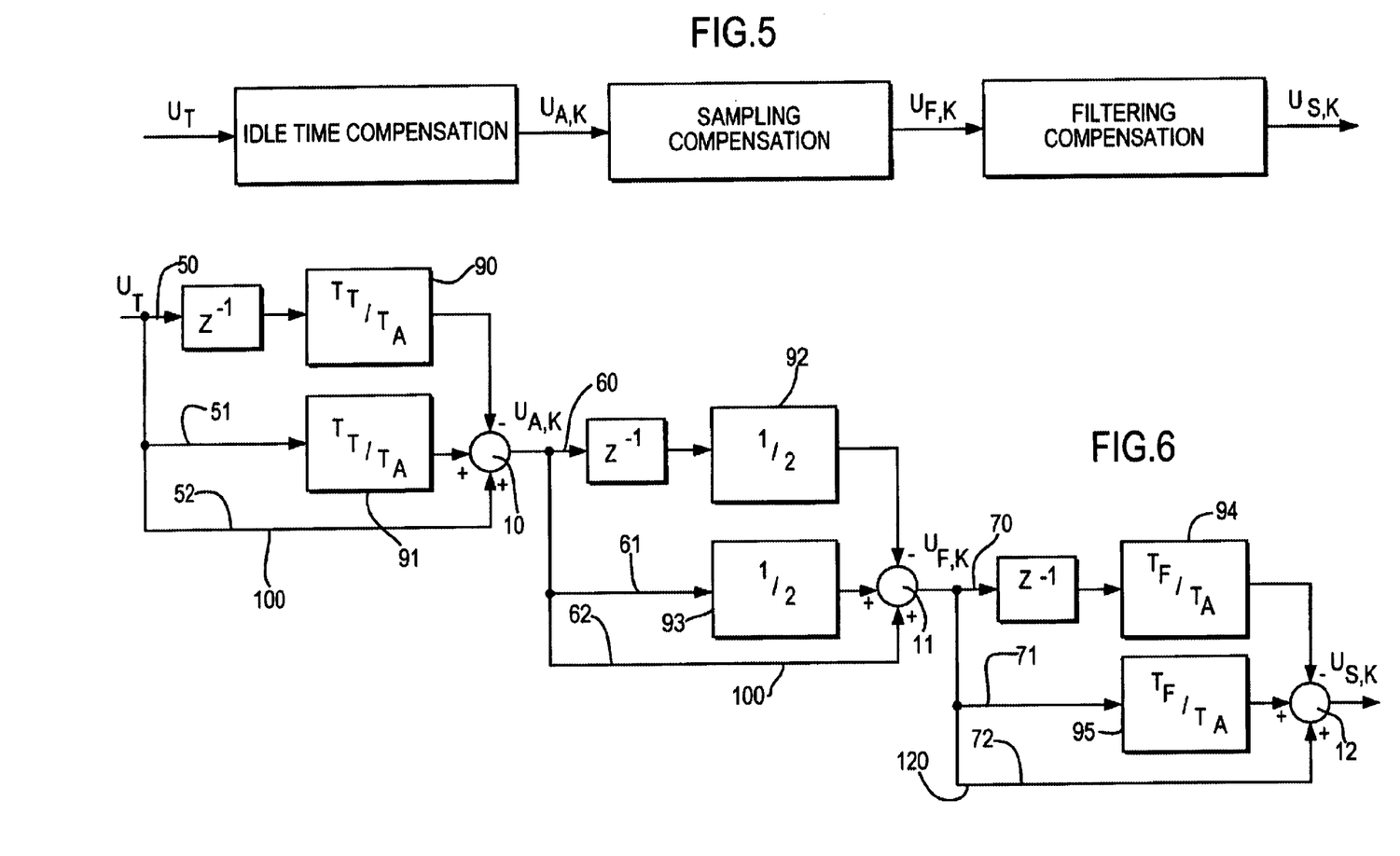
FIG. 5 is a block diagram illustrating the structure of the entire phase compensation process.
FIG. 6 shows a preferred arrangement for computational performance of the phase compensation of the invention.

According to the invention, the compensations for filtering, sampling and idle time are integrated into the signal path in the reverse order of their creation (see FIG. 5). Therefore a compensation of the idle time occurring in the further processing of the signal is treated first. It would be possible, by shifting the processing process to the task of signal detection, to minimize idle times, such as interrupt latency times. However, this takes relatively great effort and expense, so that according to the invention the attempt is made to furnish a computational compensation of the phase delay caused by the idle time. The signal delay occurring in further processing because of the idle time is shown schematically in FIG. 3. In FIG. 3, the signal values during the intervals $t = k \cdot T_A$ are designated as $x_{k-1}$ and $x_k$. It can be seen that a new value $x_{k+1}$ becomes effective with a delay $T_T$ (idle time). For the time $T_T$, the previous value $x_{k-1}$ is used for calculation. To compensate for the resultant errors in the next sampling step, the value $x_k$ is corrected with the component $$x_{k,kor} = (x_k - x_{k-1}) \cdot \frac{T_T}{T_A}.$$

The result for the compensated signal is thus $y_k = x_k + x_{k,kor}$, or $$y_{k1} = x_k \left(1 + \frac{T_T}{T_A}\right) - x_{k-1} \cdot \frac{T_T}{T_A}$$

It can be seen that this means that the error occurring during the idle time $T_T$ is imposed with an inverse sign in the next sampling step and is thus corrected.

Figure 4:
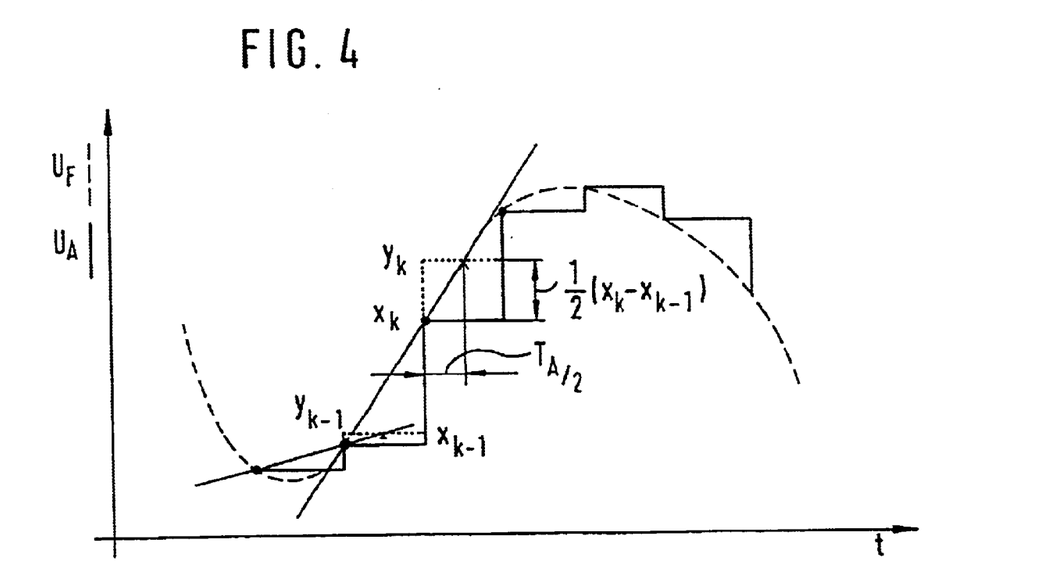
FIG. 4 is a graph showing the compensation of the sampling delay provided according to the invention.

Both the phase delay caused by the sampling and its correction will now be explained in conjunction with FIG. 4. It can be seen from this that because of the sampling, the output signal $U_F$ of the anti-aliasing filter 2 is delayed by the time $T_A/2$ on average. The goal of the compensation here is, at time t, to precalculate the value for the time $t+T_A/2$. This is expediently done by means of a linear extrapolation taking the form $$s\left(t + \frac{T_A}{2}\right) \cong s(t) + \frac{1}{2} \cdot [s(t) - s(t - T_A)].$$

By means of the compensation according to the invention, the following value is output as the corrected sampled value:

$$y_{k2} = x_k + \tfrac{1}{2} \cdot (x_k - x_{k-1}).$$

Finally, the compensation of the phase delay occurring from the use of an anti-aliasing filter will now be explained in detail.

An anti-aliasing filter embodied as a PT1 filter has the transfer function $$G_F(s) = \frac{1}{1 + sT_F}.$$

The transfer behavior of $G_F$ can be compensated for by the inverse function $$G_F^{-1}(s) = 1 + sT_F.$$

This continuous-time transfer function can be converted into a discrete-time differential equation: the step response of $G_F^I$ is $$g_\sigma(t) = \mathcal{J}^{-1}\left\{\frac{1}{s} \cdot G_F^I(s)\right\} g_\sigma(t) =$$

$$\mathcal{J}^{-1}\left\{\frac{1 + sT_F}{s}\right\} g_\sigma(t) = \mathcal{J}^{-1}\left\{\frac{1}{s} + T_F\right\} g_\sigma(t) = 1 + T_F \cdot \delta(t)$$

Here $[\mathrm{I}^{-1}]$ designates the inverse Laplace transform, and $\delta(t)$ is the Dirac function. The discrete-time function of $g_o(t)$ is $$g_\sigma(kT_A) = 1 + T_F \cdot \delta(kT_A)$$

The z transform of this function is $$G_\sigma(z) = \frac{z}{z-1} + \frac{T_F}{T_A}.$$

$G_o(z)$ is the z transform of the transfer response [ditto]. The z transfer behavior is obtained by dividing $G_o(z)$ by the z transform of the step function:

$$\sigma(z) = \frac{z}{z-1}$$

It thus follows that $$G_F^I(z) = \frac{G_\sigma(z)}{\sigma(z)} = 1 + \frac{z-1}{z} \cdot \frac{T_F}{T_A} = \frac{z\left(1 + \frac{T_F}{T_A}\right) - \frac{T_F}{T_A}}{z} = \frac{y(z)}{x(z)}$$

This equation can be solved for y:

$$y(z) = x(z) \cdot \left(1 + \frac{T_F}{T_A}\right) - z^{-1} \cdot \frac{T_F}{T_A} \cdot x(z)$$

By retransformation to the time range, finally, the differential equation $$y_{k3} = x_k + T_F/T_A \cdot (x_k - x_{k-1}).$$

As already noted, it is provided according to the invention that the described compensations for filtering, sampling and idle time be integrated into the signal path in the reverse order of their cause or creation. The described idle time compensation generates a signal $U_A k$, the downstream sampling compensation generates a signal $U_{F,K}$, and the ensuing filtering compensation generates the output signal $U_{S,K}$ (see FIG. 5).

A block circuit diagram for achieving these compensation functions is shown in FIG. 6. Three series-connected phase compensation switching blocks 100, 110, 120 can be seen, each of which has three parallel signal transmission channels 50, 51, 52; 60, 61, 62; and 70, 71, 72. In them, $z^{-1}$ delay members are shown, which delay an entering signal by one sampling period $T_A$. Elements 90–95 are multiplier members, which perform multiplications by the various factors shown. Adding and subtracting members 10, 11, 12 are also provided. In this version of the compensation functions, the work signal $U_T$ is first (at 100) supplied unchanged, multiplied by a factor $T_T/T_A$, and delayed by one sampling period and multiplied by the factor $T_T/T_A$, to the first summation element 10. The output signal of the summation element 10, which corresponds to the compensated signal $y_{k1}$ and $U_A k$, respectively, is supplied (at 110), correspondingly unchanged, multiplied by the factor ½, and delayed by one further sampling period and multiplied by a factor ½, to a second summation element 11. The summation element 11 generates a summation signal corresponding to the compensated signals $y_{k2}$. The overall output signal is then the signal $U_{F,K}$, which in turn (at 120) is supplied in the same way, namely unaltered, multiplied by a factor $T_T/T_A$, and delayed by a further sampling period and multiplied by the factor $T_T/T_A$, to a third adder 12, which generates a signal corresponding to the compensated signal $y_{k3}$. The output signal of the summation element 12, $U_{S,K}$ represents the finally compensated output signal according to the invention.

For calculating this compensation, the following equation is thus obtained:

$$U_{S,K}(k) = U_T(k) \cdot \left[1{,}5 + 1{,}5 \cdot \frac{T_T}{T_A} + 1{,}5\frac{T_F}{T_A} + 1{,}5\frac{T_T T_F}{T_A^2}\right] -$$

$$U_T(k-1) \cdot \left[0{,}5 + 2 \cdot \frac{T_T}{T_A} + 2 \cdot \frac{T_F}{T_A} + 3{,}5 \cdot \frac{T_T T_F}{T_A^2}\right] +$$

$$U_T(k-2) \cdot \left[0{,}5 \cdot \frac{T_F}{T_A} + 0{,}5 \cdot \frac{T_T}{T_A} + 2{,}5 \cdot \frac{T_T T_F}{T_A^2}\right] -$$

-continued $$U_T(k-3) \cdot \left[0{,}5 \cdot \frac{T_T T_F}{T_A^2}\right]$$

The terms in brackets represent system constants of the signal detection path. The equation can therefore be shown in the following form as well:

$$U_{S,K}(k) = A \cdot U_T(k) + B \cdot U_T(k-1) + C \cdot U_T(k-1) + C \cdot U_T(k-3)$$

The values $U_T(k-l)$, where l=0 to 3, represent uncompensated signals $U_T$ delayed by l sampling periods. An equation of this structure can be realized in a simple way with the circuit arrangement shown in FIG. 7. For the sake of simplicity, delay members $T_A$ are shown which each delay an incoming signal by one sampling period, and multiplier members 191–194 are shown which multiply the values $U_T(k-l)$ by the corresponding factors A, B, C, D. The signals multiplied by the factors A, B, C, D are added by one another in an adder member 30.

Figure 7:
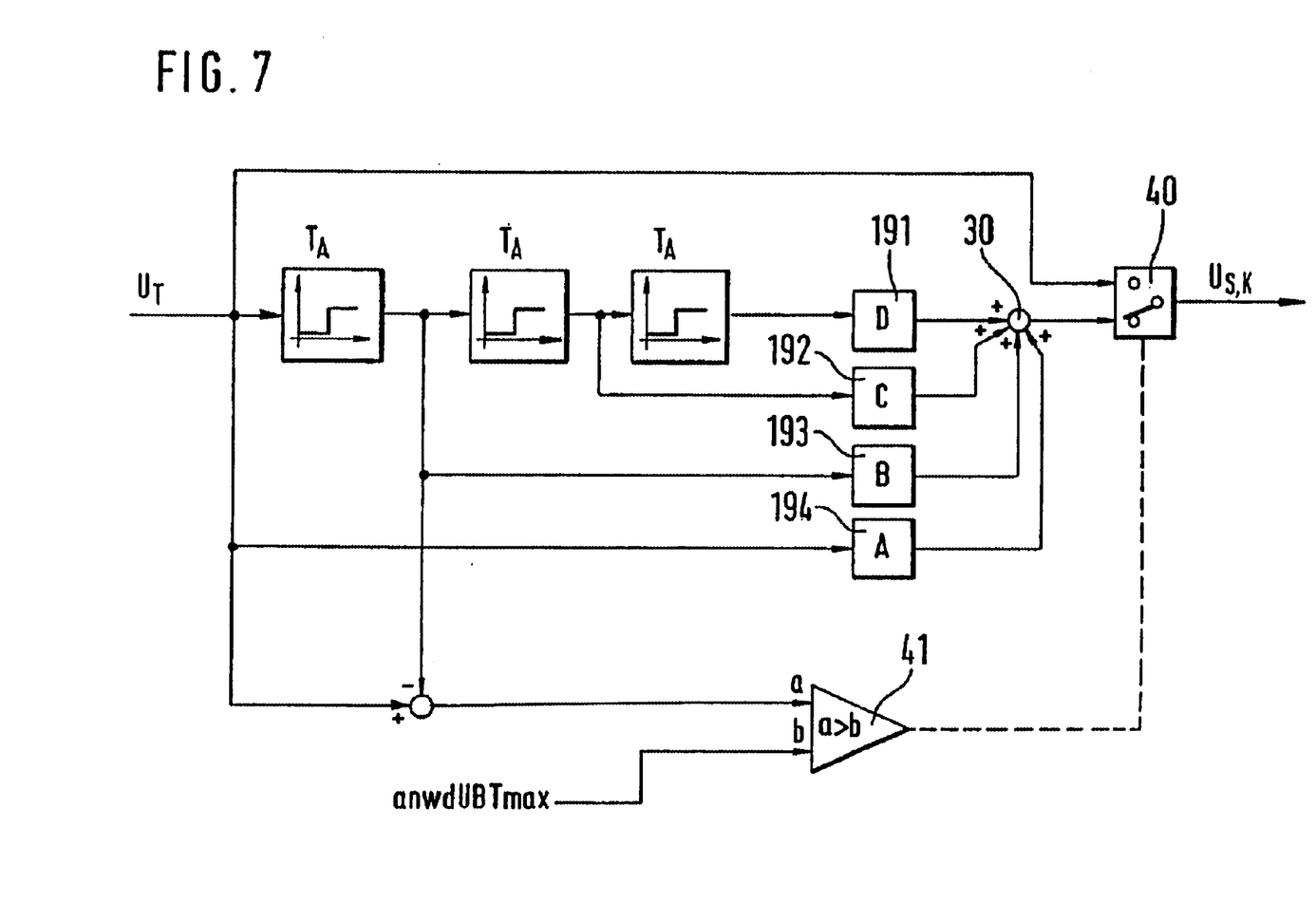
FIG. 7 shows a further preferred arrangement for computational performance of the phase compensation of the invention.

The circuit arrangement shown in FIG. 7 proves to be highly favorable, because the requisite computation effort for performing the phase delay compensation according to the invention is very slight. All that is required is to perform signal delays and to multiply the delayed input signals by the corresponding constants A, B, C, D, dictated by the system, and to add the resultant values together. The circuit arrangement shown in FIG. 7 can be realized highly economically in either hardware or software form.

In the event of very fast signal changes at the input to the compensation circuit in FIG. 7, to prevent severe fluctuations from occurring in the compensated signal, the correction is turned off (switch 40) if the change in the input signal $U_T$ within one sampling step exceeds a threshold value (anwdUBTmax). A comparison of the change in the input signal with the threshold value is made in a comparator 41.

A typical application of the phase compensation according to the invention will now be described in detail, in conjunction with FIGS. 8–12. In a preferred embodiment, the phase delay compensation of the invention is realized in the detection of the battery voltage, for instance for an engine control unit of a common rail system. The battery voltage supplies electric actuators, among other elements, which trigger magnet valves. Fluctuations in the battery voltage causes fluctuations in the magnet valve current. To reduce this influence, a battery voltage correction is performed, which corrects the control value upward or downward depending on the current battery voltage. This correction function is severely impaired, however, by signal delays in detecting the battery voltage. This means that fluctuations in the battery voltage itself, when corrected, lead to a current fluctuation. With the compensation according to the invention as shown, this current fluctuation can be greatly minimized. Among other effects, this also leads to a smoother rail pressure course in a common rail system.

Figure 8:
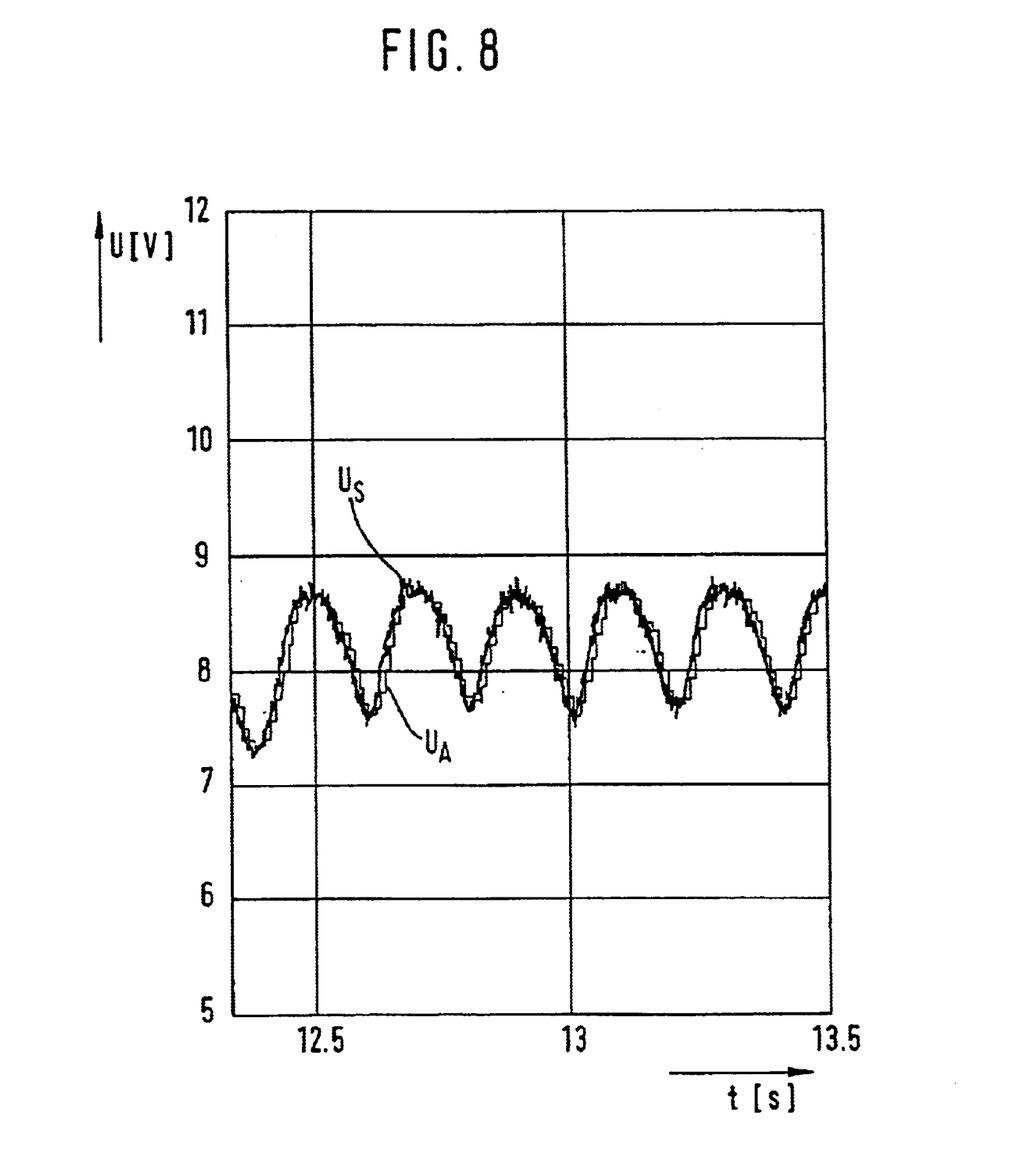
FIG. 8 shows the course of a battery voltage during an operation of starting a motor vehicle.

In FIG. 8, the battery voltage in the starting phase of a motor vehicle is plotted over time (signal $U_S$). A digital signal obtained by sampling (without phase compensation according to the invention) is also shown in FIG. 8 (signal $U_A$).

Figure 9:
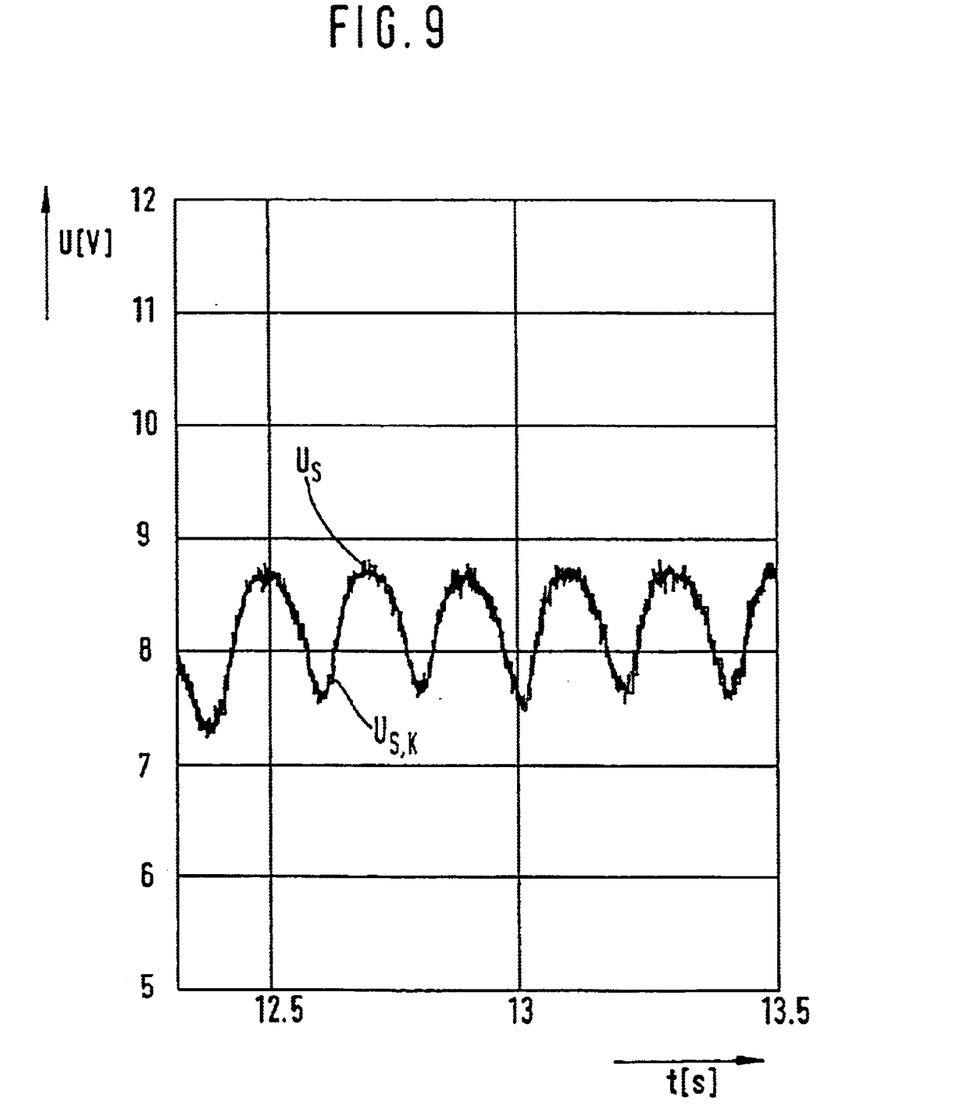
FIG. 9 shows the course of the battery voltage of FIG. 8 after a phase compensation of the invention.

In FIG. 9, the signal $U_S$ is shown together with a signal $U_{S,K}$ that is phase-compensated according to the invention. It can be seen that by means of the phase compensation of the invention, a substantially more-precise approximation to the voltage output signal of the battery ($U_S$) is attainable.

Figure 10:
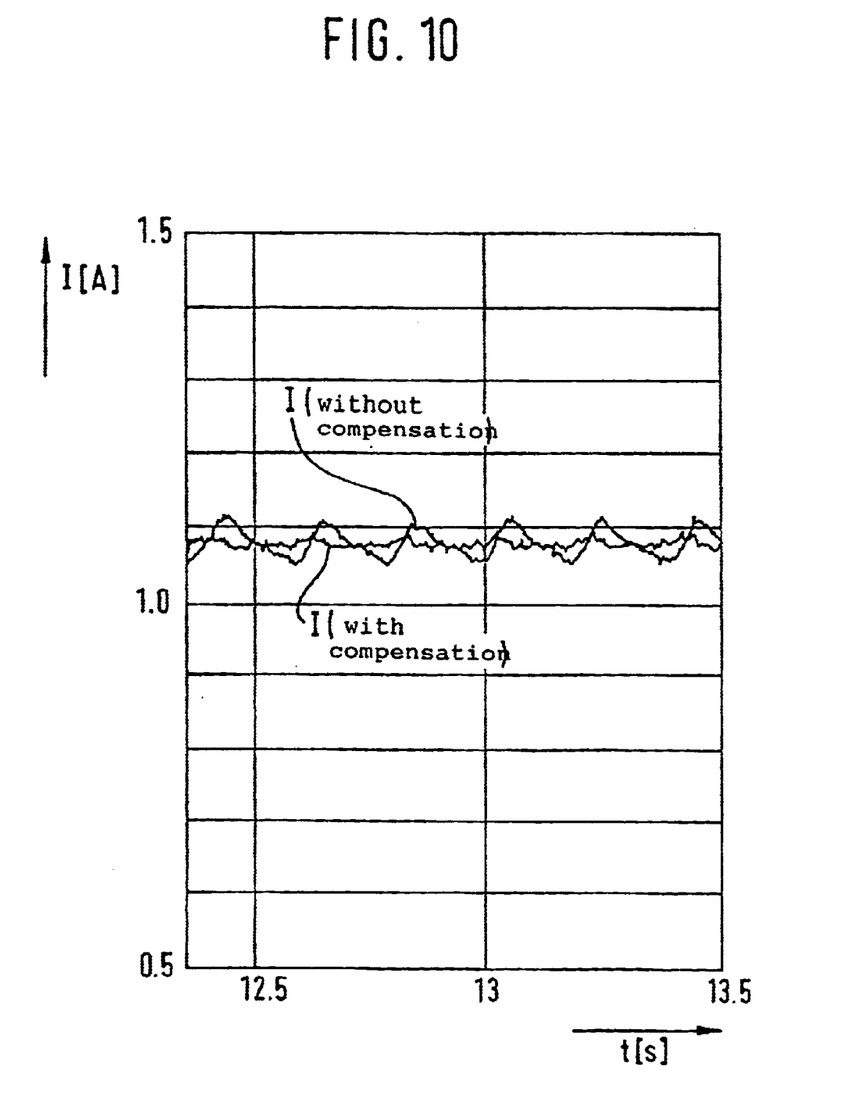
FIG. 10 shows a corresponding current course with and without the phase compensation of the invention.

In FIG. 10, a magnet valve current I is plotted over time as a function of the battery voltage courses $U_A$ (without compensation) and $U_{S,K}$ (with compensation). It can be seen that the magnet valve current furnished by the phase compensation of the invention has substantially less fluctuation.

Figure 11:
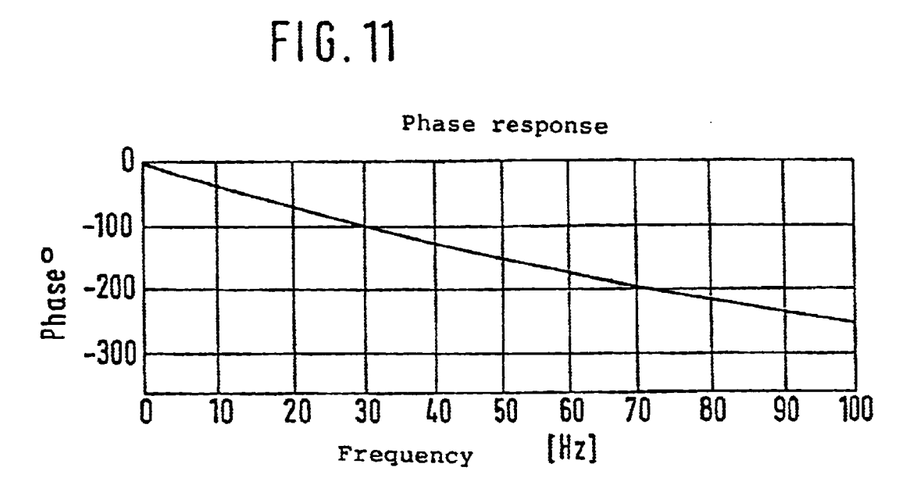
FIG. 11 shows a simulated phase response of a signal path which has an anti-aliasing filter and a sampling member, without the phase compensation of the invention.
Figure 12:
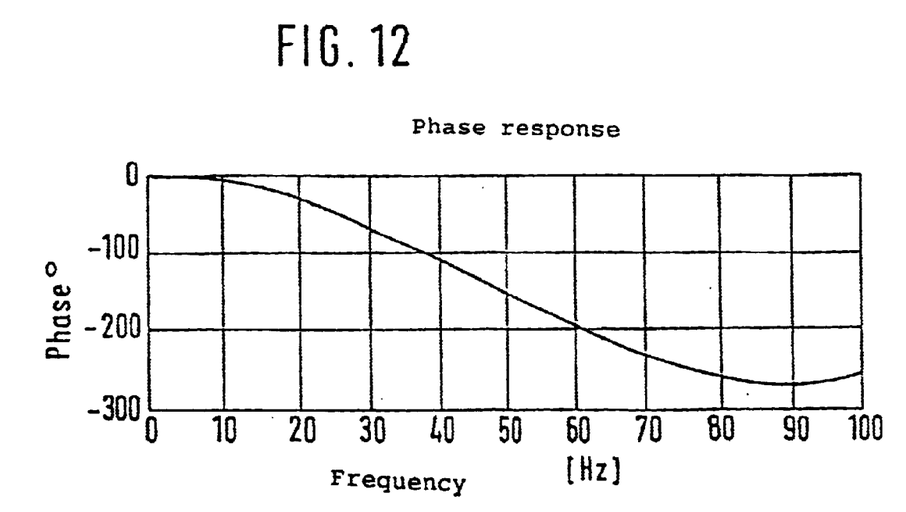
FIG. 12 shows a simulated phase response of a signal path which has an anti-aliasing filter and a sampling member, with the phase compensation of the invention.

With reference to FIGS. 11 and 12, the phase delay compensation of the invention will be explained further. Here, a simulation of the signals that occur in a signal detection path with an anti-aliasing filter and a sampling member has been done. A filter time constant $T_F$ of the anti-aliasing filter of 6 ms and a sampling period $T_A$ of the sampling member of 10 ms have been assumed. FIG. 11 shows the phase response that occurs without the phase compensation of the invention. It can be seen that even at low frequencies (beyond 1 Hz), marked phase delays occur.

In FIG. 12, the phase response of the signal path phase-compensated according to the invention, that is, the signal path comprising the anti-aliasing filter, sampling member, compensation of the anti-aliasing filter, and compensation of the sampling member, is shown. It can be seen that up to frequencies of about 7 to 8 Hz, a substantially complete compensation of the incident phase delays is possible. Battery voltage fluctuations occurring during the starting process, which typically are in the range from 5 to 8 Hz, can thus be compensated for highly effectively. From FIGS. 11, 12 it can be seen that the phase compensation of the invention causes a phase increase and thus an increase in the incident idle times.

What is claimed is:

1. A method for compensation of phase delays that occur in discrete sampling of an analog output signal ($U_S$), comprising the steps of subjecting the output signal ($U_S$) to signal processing by an anti-aliasing filter and then by a sampling member to obtain a sampling signal ($U_A$) that has a sampling period (T); compensating a phase delay of the sampling signal caused by the sampling member; taking into account the sampling signal of a preceding sampling period to obtain a signal ($U_{F,K}$); and compensating the phase delay of the sampling signal caused by the anti-aliasing filter, taking into account a filter time constant ($T_F$) of the anti-aliasing filter, a sampling period ($T_A$) of the sampling member, and the sampling signal of the preceding sampling period, to obtain a signal ($U_{SK}$).

2. A method as defined in claim 1; and further comprising, in the case of a further phase delay of the sampling signal ($U_A$) caused by an idle time ($T_T$) which occurs in further processing of the sampling signal and by which an idle-time-delayed sampling signal ($U_T$) is generated, performing a compensation of the phase delay of the sampling signal ($U_T$) caused by the idle time, taking into account the idle time ($T_T$) the sampling period of the sampling member, and the sampling signal of the preceding sampling period, to obtain an idle-time-compensated sampling signal ($U_{A,K}$) and subjecting the idle-time-compensated sampling signal ($U_{A,K}$) to the phase shift compensation of claim 1 for the sake of further phase compensation.

3. A method as defined in claim 1; and further comprising correcting the phase delay caused by the sampling member, which delay can be represented by the equation $$\varphi_A = \omega \cdot \frac{1}{2} \cdot T_A = -2 \cdot \pi \cdot f \cdot \frac{T_A}{2} = -\pi \cdot f \cdot T_A$$

which f is the signal frequency and $T_A$ is the sampling period of the sampling member, by means of a linear extrapolation using a correction value of the form $-y_{k,2} = X_k + \frac{1}{2} \cdot (x_k - x_{k-1})$, in which $x_{k-1}$, $x_k$ are values of the sampling period in successive sampling periods $T_{T,k-1}$, $T_{T,k}$.

4. A method as defined in claim 1; and further comprising correcting a phase delay which is caused by the anti-aliasing filter and can be represented in the form $\phi_F = \arctan(2 \cdot \pi \cdot f \cdot T_F)$, in which $T_F$ is the filter time constant of the anti-aliasing filter, by a correction value of the form $$y_{K,3} = x_K + \frac{T_F}{T_A} \cdot (x_k - x_{k-1}).$$

5. A method as defined in claim 1; and further comprising correcting the phase delay which is caused by the idle time ($T_T$) and can be represented in the form $\phi_V = -\arctan(2\pi f_F) - \pi f T_A - 2\pi f T_T$, by a correction value of the form $$\gamma_{k,1} = x_k \left(1 + \frac{T_T}{T_A}\right) - x_{k-1} \cdot \frac{T_T}{T_A}.$$

6. A method as defined in claim 1; and further comprising performing the individual phase delay compensations successively, so that for correcting a sampling signal ($U_A$, $U_T$) during one sampling period, sampling signals of two or three preceding sampling periods are taken into account.

7. A method as defined in claim 1; and further comprising performing the individual phase delay compensations in reverse order from the order in which they occurred.

8. An arrangement or compensation of phase delays that occur in discrete-time sampling of an output signal ($U_S$) in which the output signal ($U_S$) is subjected to signal processing by an anti-aliasing filter to obtain a signal ($U_F$) and then by a sampling member for obtaining a sampling signal ($U_A$), the arrangement comprising means for compensation for a phase delay of the sampling signal caused by the sampling member, taking into account the sampling signal of a preceding sampling period; and means for compensation of the phase delay of the sampling signal caused by the anti-aliasing filter, taking into account a filter time constant ($T_F$) of the anti-aliasing filter, the sampling period ($T_T$) of the sampling member, and the sampling signal of preceding sampling period.

9. An arrangement as defined in claim 8; and further comprising means for compensation of a sampling signal phase delay which is caused by an idle time ($T_T$) occurring in a further processing of the sampling signal by which a signal ($U_T$) is obtained, taking into account the idle time ($T_T$), the sampling period ($T_A$) and the sampling signal of the preceding sampling period, to obtain an idle-time-compensated sampling signal ($U_{A,K}$); and means for delivering this idle-time-compensated sampling signal ($U_{A,K}$) to the phase delay mean for further time compensation.

10. An arrangement as defined in claim 8, wherein said means for compensation of the phase delay caused by the sampling member, the anti-aliasing filter or the further processing idle time ($T_T$), each have a number of parallel signal transmission channels, in which a first signal transmission channel serves to transmit an unaltered sampling signal, a second signal transmission channel having a multiplier member serves to transmit a sampling signal multiplied by a factor, and a third signal transmitting channel having a delay member and a multiplier member serves to transmit a sampling signal delayed by one sampling period and multiplied by factor, to a summation member.

11. An arrangement as defined in claim 10, wherein said means for compensation of the phase delay caused by the sampling member, the anti-aliasing filter, or the further processing idle time ($T_T$) are connected in series with one another in such a way that a phase-compensated output signal ($U_{S,K}$) is obtained, taking into account the uncompensated sampling signals ($U_T$) of the preceding three sampling periods.

12. An arrangement as defined in claim 8, wherein a number of series-connected delay members, multiplier members connected to them and parallel to one another, and a summation member for adding the output signals of the multiplier members to achieve a phase compensation are provided, to achieve a phase compensation for obtaining a phase-compensated sampling signal ($U_{S,k}$) of the form $U_{S,K}(k) = A \cdot U_T(k) + B \cdot U_T(k-1) + C \cdot U_T(k-1) + D \cdot U_T(k-3)$, in which $U_T(k-i)$, where $i=0, 1, 2, 3$ represents the uncompensated sampling signal ($U_T$) delayed by i sampling periods, and A, B, C, D are system constants of a signal sampling path.

13. An arrangement as defined in claim 12, and further comprising means for turning off the phase compensation in the event that a change in the input signal within one sampling period exceeds a threshold value (anwdUBTmax).

* * * * *